United States Patent
Rusu et al.

(10) Patent No.: US 6,942,816 B2
(45) Date of Patent: Sep. 13, 2005

(54) METHODS OF REDUCING PHOTORESIST DISTORTION WHILE ETCHING IN A PLASMA PROCESSING SYSTEM

(75) Inventors: Camelia Rusu, Fremont, CA (US); Mukund Srinivasan, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 135 days.

(21) Appl. No.: 10/366,201

(22) Filed: Feb. 12, 2003

(65) Prior Publication Data
US 2004/0155012 A1 Aug. 12, 2004

(51) Int. Cl.[7] ............................................. H01L 21/00
(52) U.S. Cl. ..................... 216/49; 216/67; 216/79; 216/80; 438/710; 438/723; 438/725
(58) Field of Search .............................. 216/49, 67, 79, 216/80; 438/710, 723, 725

(56) References Cited

U.S. PATENT DOCUMENTS

| | | | |
|---|---|---|---|
| 5,893,757 A | * | 4/1999 | Su et al. ................. 438/713 |
| 6,228,775 B1 | | 5/2001 | Coburn et al. .............. 438/714 |
| 6,355,181 B1 | | 3/2002 | McQuarrie .................... 216/2 |
| 6,649,531 B2 | * | 11/2003 | Cote et al. ................. 438/714 |
| 6,746,961 B2 | * | 6/2004 | Ni et al. .................... 438/700 |
| 6,797,189 B2 | * | 9/2004 | Hung et al. ................. 216/67 |
| 2003/0232504 A1 | * | 12/2003 | Eppler et al. .............. 438/709 |

OTHER PUBLICATIONS

International Search Report, dated Dec. 17, 2004.

* cited by examiner

*Primary Examiner*—Allan Olsen
(74) *Attorney, Agent, or Firm*—Beyer Weaver & Thomas LLP

(57) ABSTRACT

A method for substantially reducing photoresist wiggling while etching a layer on a substrate is provided. The substrate having thereon the layer disposed below a photoresist mask is introduced into the plasma processing chamber. An etchant source gas mixture is flowed into the plasma processing chamber, where the etchant source gas mixture comprises xenon and an active etchant, where a flow rate of the xenon is at least 35% of etchant source gas mixture. A plasma is struck from the etchant source gas mixture. The layer is etched with the plasma, where the flow rate of xenon reduces photoresist wiggling.

8 Claims, 12 Drawing Sheets

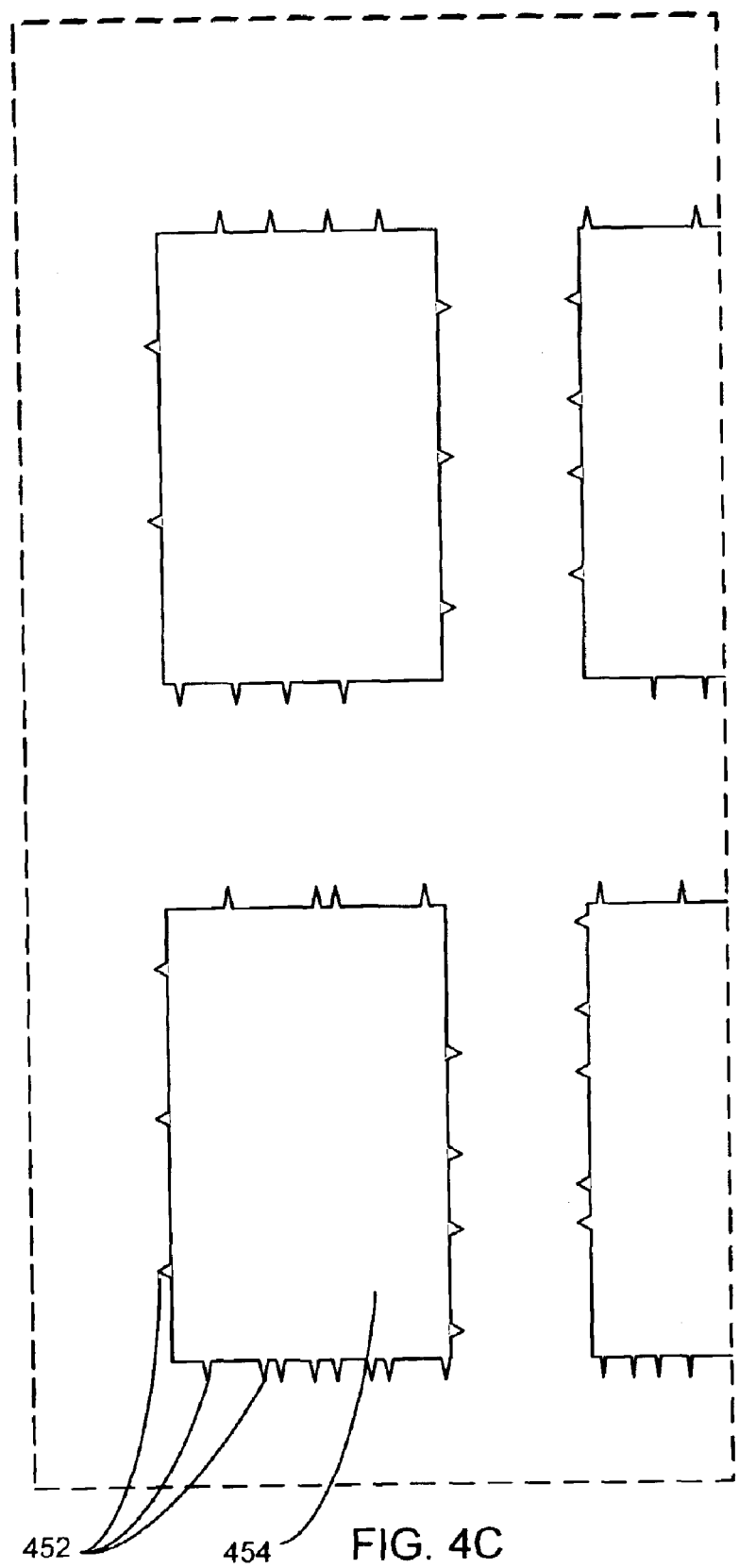
452  454  FIG. 4C

US 6,942,816 B2

METHODS OF REDUCING PHOTORESIST DISTORTION WHILE ETCHING IN A PLASMA PROCESSING SYSTEM

BACKGROUND OF THE INVENTION

The present invention relates in general to substrate manufacturing technologies, and in particular to methods for reducing photoresist distortion while etching a substrate in a plasma processing system.

In semiconductor fabrication, devices such as component transistors may be formed on a substrate, e.g., a semiconductor wafer or a glass panel. Above the substrate, there may be disposed a plurality of layers from which the devices may be fabricated. To facilitate understanding, the discussion that follows focuses on oxide etching in which a wafer having thereon a photoresist mask and an oxide layer disposed thereunder is etched in a plasma etcher.

Using plasma generated from an etchant source gas that includes oxygen, argon, and fluorocarbon and/or hydrofluorocarbon, areas of the oxide layer that are unprotected by the mask are etched away, leaving behind vias, contacts, and/or trenches that eventually form electrical structures on the substrate.

Generally speaking, irrespective of the composition of the etchant source gas, the generated plasma typically includes, besides molecules and radicals, ions having energy in the millielectronvolt (meV) range and electrons having energy in the electron volt (eV) range. During the plasma etch process, as a consequence of the ion bombardment (lower energy but larger mass) and/or electron bombardment (lower mass but considerably higher energy), the photoresist mask may experience distortion that is commonly called wiggling.

The distortion may affect just the top surface of the photoresist or it can be more extensive, affecting the vertical sidewalls of the photoresist. Once the distortion starts, the severity of the distortion tends to increase as the etch progresses. Also, depending on the chemistry employed during the etch process, the degree of photoresist distortion may vary.

To facilitate discussion, FIG. 1A illustrates a simplified cross-sectional view of a layer stack 100, representing the layers of an exemplary semiconductor IC prior to a lithographic step. In the discussions that follow, terms such as "above" and "below," which may be employed herein to discuss the spatial relationship among the layers, may, but need not always, denote a direct contact between the layers involved. It should be noted that other additional layers above, below, or between the layers shown may be present. Further, not all of the shown layers need necessarily be present and some or all may be substituted by other different layers.

At the bottom of layer stack 100, there is shown a silicon dioxide layer 108, typically comprising $SiO_2$. Above the silicon dioxide layer 108, there is disposed an overlaying photoresist layer 102.

Photoresist layer 102 is commonly patterned for etching through exposure to light, such as ultra-violet light. By way of example, one such photoresist technique involves the patterning of photoresist layer 102 by exposing the photoresist material in a contact or stepper lithography system to form a mask that facilitates subsequent etching.

For illustration purposes, FIG. 1B shows an idealized cross-sectional view of layer stack 100 of FIG. 1A after photoresist layer 102 has been formed via the lithography step. In this example, photoresist has been removed to form a photoresist trench 112, leaving two columns of photoresist 102. Since modern IC circuits are scaled with increasingly narrower design rules to achieve greater circuit density, feature sizes (i.e., the cross-section dimensions 110 of the vias, trenches, or contacts) have steadily decreased.

FIG. 2 shows the cross-sectional view of a layer stack 220 in which photoresist layer 202 has been distorted during the etch. As seen in FIG. 2, horizontal surface 210 and vertical surface 212 have been substantially distorted during the plasma etch. The asymmetric polymer deposition on the sides of the photoresist mask 212 and the asymmetric photoresist faceting 218 are the main factors that accompany the distortion of the photoresist mask. As a consequence of the distortion, the photoresist mask may not have sufficient strength to withstand further plasma bombardment, and consequently, the photoresist columns may fall over, partially or totally covering the opening of the feature to be etched 214. Accordingly, the distortion may cause defects in the resultant etch features, leading to a lower percentage yield.

In particular, it has been observed that the distorted photoresist exhibits wiggling, or wave-like patterns in the columns of the photoresist material when viewed from the top of the substrate. To illustrate, FIG. 3 shows a top view of a distorted photoresist mask 320 in which the plasma etching process has created wiggles 302 in the photoresist layer. The resulting mask pattern can partially or completely block the intended removal of the substrate material. The photoresist mask 320 was originally patterned to form rectangular features. However, distortion of the photoresist causes irregularly shaped features 312, as shown.

If the photoresist mask suffers from excessive wiggling, striations can occur. Striations may be caused when photoresist wiggling exposes certain, irregular faceted photoresist portions of the photoresist columns to the vertical etch component, where such photoresist portions are normally protected from the vertical etch component had there been no photoresist wiggling. With reference to FIG. 4A, the exposed photoresist portions are shown by shaded portions 406, which are exposed to the vertical etch component 410 after photoresist wiggling causes the photoresist columns 402 to bend over.

The result of etch process is shown in FIG. 4B in which underlying oxide regions 408 are undesirably removed by the etch process, causing etch features 404 to have an irregular shape, different than the intended. Thus, the feature may have an enlarged distorted sidewall 414 instead of the intended sidewall 412. The striations are shown in exemplary FIG. 4C as undesirable sharp "vertical trenches" 452 in the otherwise smooth vertical sidewalls of the vias 454. Such striation in the etched features alters the intended electrical and functional characteristics of the resultant device, leading to defects in the resultant device.

Additionally or alternatively, if the photoresist wiggles converge and protrude inside the intended outline of the mask hole (as viewed from the top of the substrate), the resulting distorted mask pattern can partially or completely block the intended removal of substrate material. These randomly affected vias represent defects in the resulting device and undesirable lowering yield. FIG. 5 is a cross sectional view of an etched feature 504 in a substrate 508, where the photoresist wiggles have caused the photoresist 502 to form a partial block 520, which partially blocks the etching of the feature 504 in the substrate 508.

FIG. 6 is a cross-sectional view of a substrate with a photoresist mask 602, where wiggling of the photoresist mask 602 has caused the photoresist to create a complete block 606 over a feature 604. The complete block 606 of the photoresist 602, stops the etching of the feature, so that the feature 604 is only partially etched in the substrate 608, as shown.

SUMMARY OF THE INVENTION

The invention relates, in one embodiment, to a method for substantially reducing photoresist wiggling while etching a layer on a substrate. The substrate having thereon the layer disposed below a photoresist mask is introduced into the plasma processing chamber. An etchant source gas mixture is flowed into the plasma processing chamber, where the etchant source gas mixture comprises xenon and an active etchant, where a flow rate of the xenon is at least 35% of etchant source gas mixture. A plasma is struck from the etchant source gas mixture. The layer is etched with the plasma, where the flow rate of xenon reduces photoresist wiggling.

The invention relates, in another embodiment, to a method for substantially reducing photoresist wiggling while etching a layer on a substrate. The substrate having thereon the layer disposed below a photoresist mask is introduced into the plasma processing chamber. An etchant source gas mixture is flowed into the plasma processing chamber, where the etchant source gas mixture comprises xenon, active etchant and argon, where a flow rate of the xenon is at least 40% of a sum of flow rates of the xenon and argon. A plasma is struck from the etchant source gas mixture. The layer is etched with the plasma.

The invention relates, in another embodiment to a plasma processing system for reducing photoresist wiggling while etching a layer on a substrate. A plasma processing chamber is provided, within which the substrate is placed. A plasma ignition device for igniting and maintaining a plasma is provided. A plasma gas source for providing an etchant source gas mixture comprising xenon and an active etchant is provided. The plasma gas source comprises an active etchant source and a xenon source for providing a high flow rate of xenon.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 4C is a top view of an etched substrate with sharp "vertical trenches".

DETAILED DESCRIPTION OF THE PREFERRED EMBODIMENTS

Figure 1A:
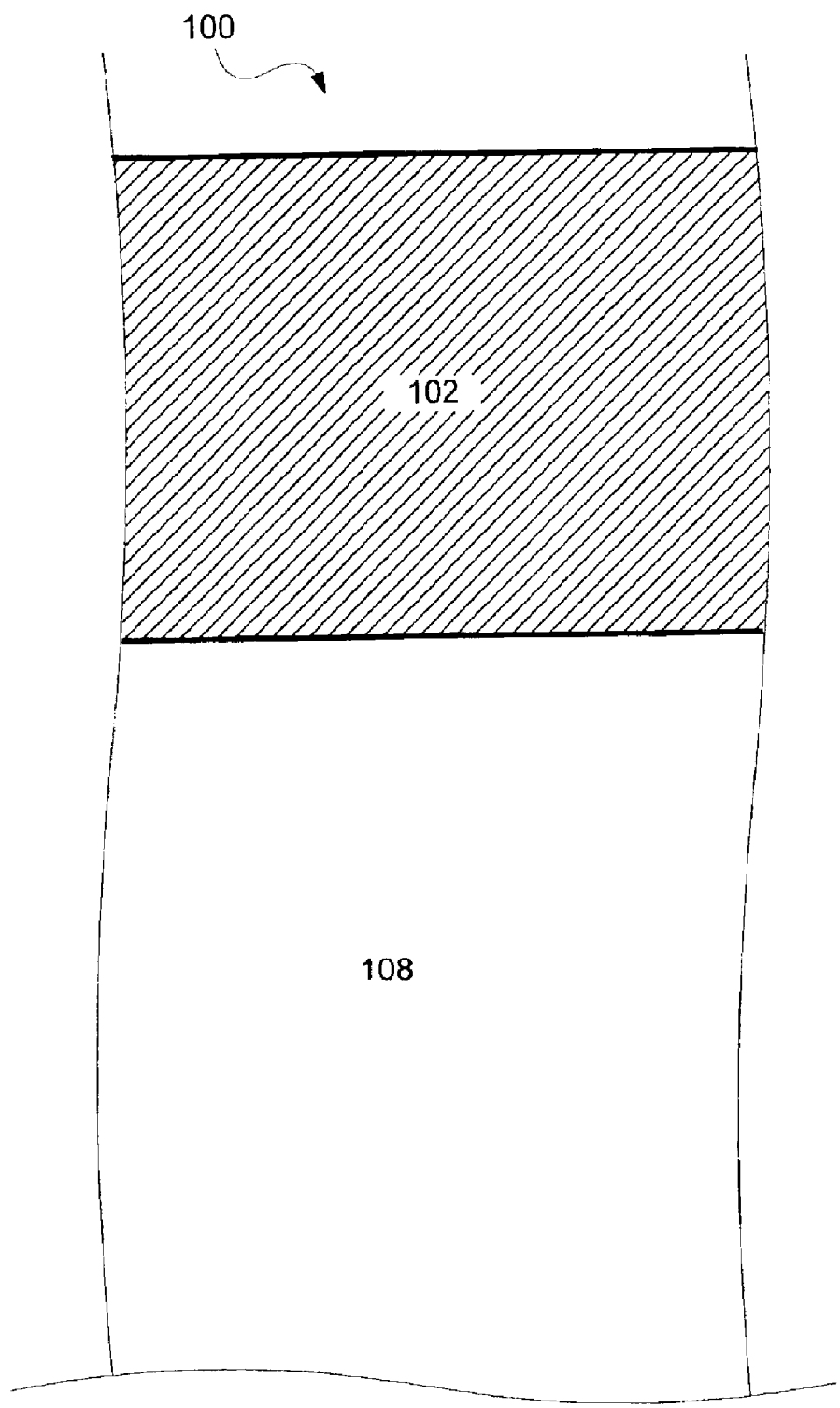
FIG. 1A is a simplified cross-sectional view of a layer stack.
Figure 1B:
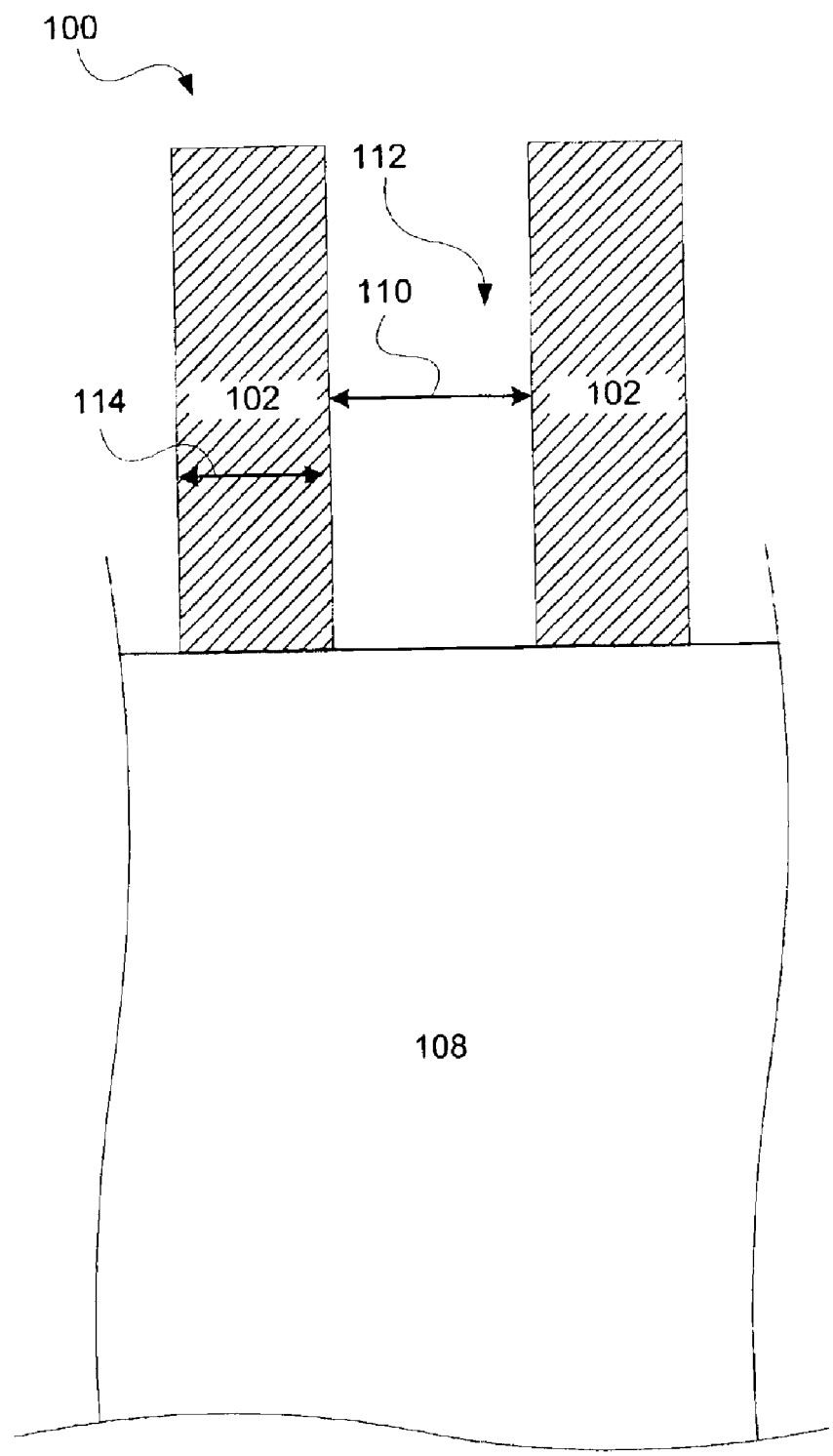
FIG. 1B is a simplified cross-sectional view of the layer stack of FIG. 1A after a photoresist layer has been patterned.
Figure 2:
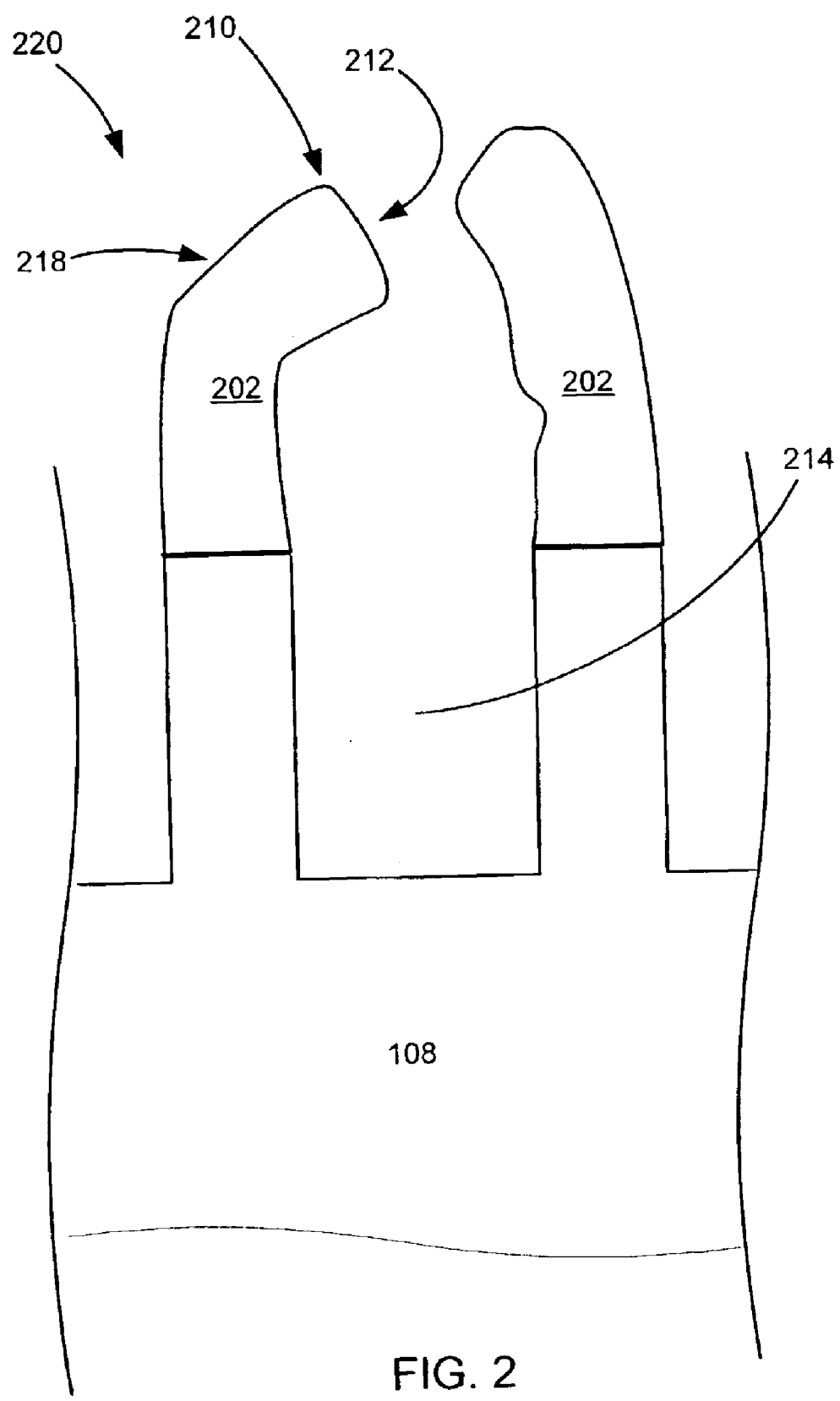
FIG. 2 is a cross-sectional view of the layer stack of FIG. 1B, which shows a photoresist that has been distorted by an etch.
Figure 3:
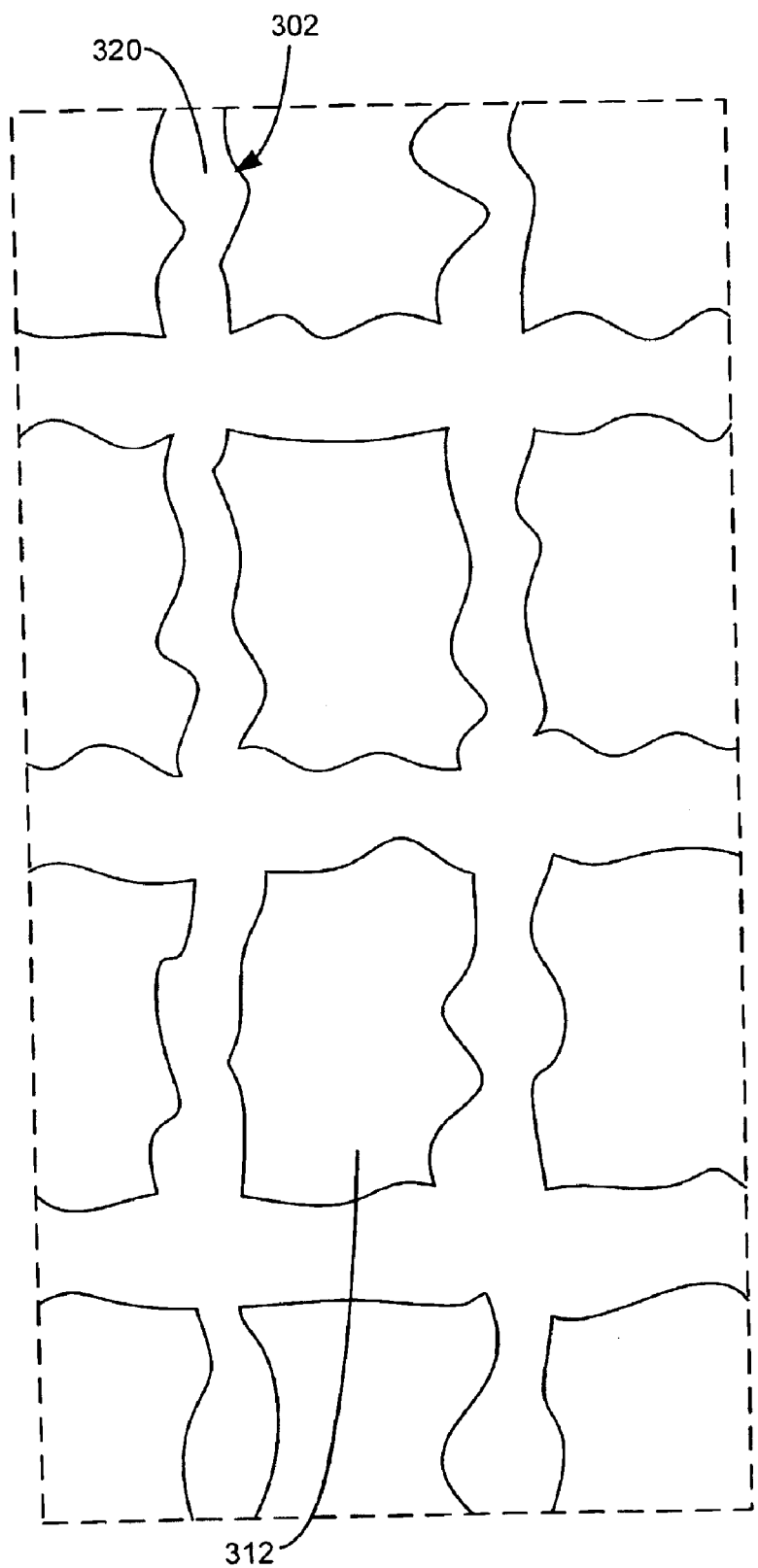
FIG. 3 is a top view of a distorted photoresist mask.
Figure 4A:
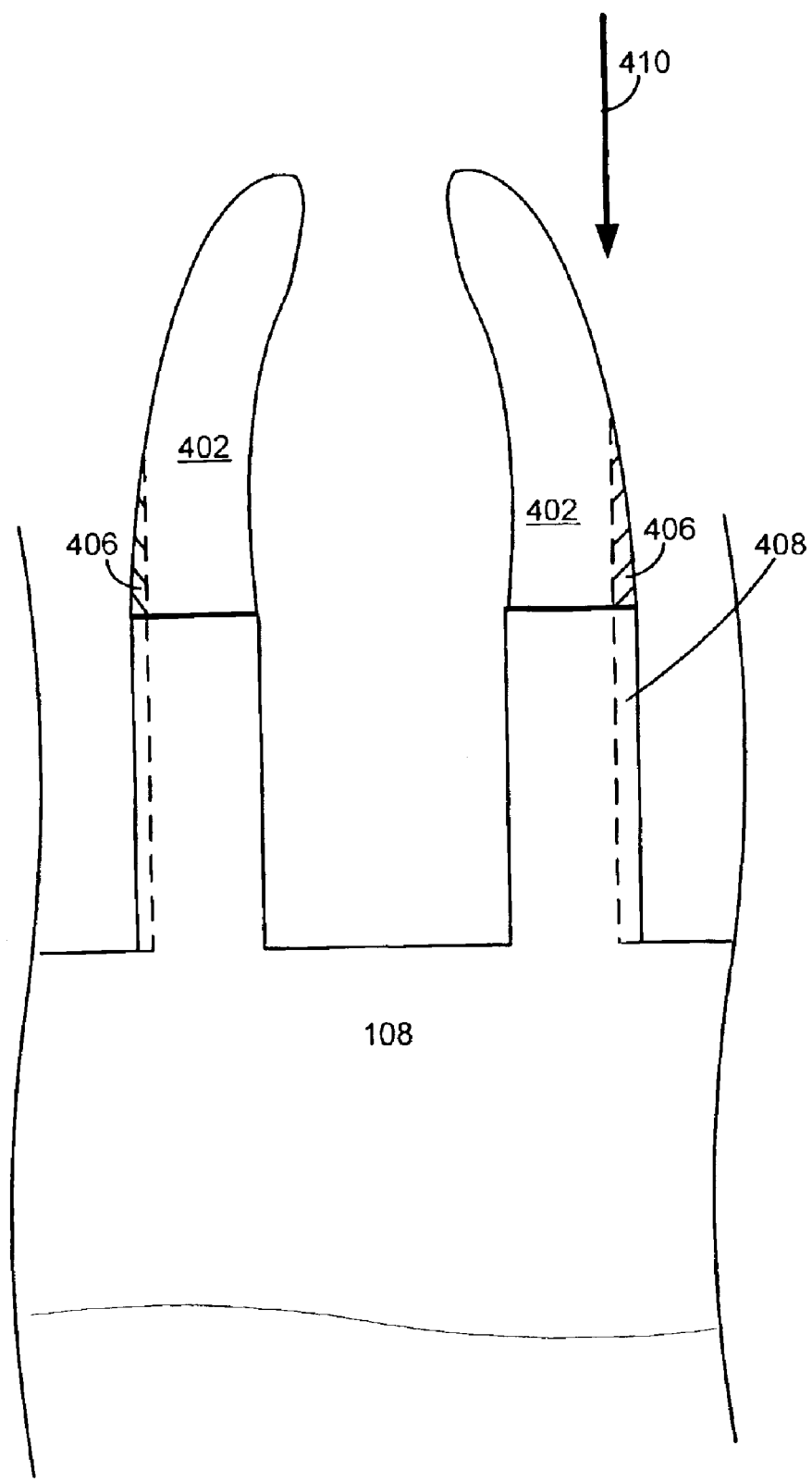
FIG. 4A is another cross-sectional view of a layer stack, which shows a photoresist that has been distorted by an etch.
Figure 4B:
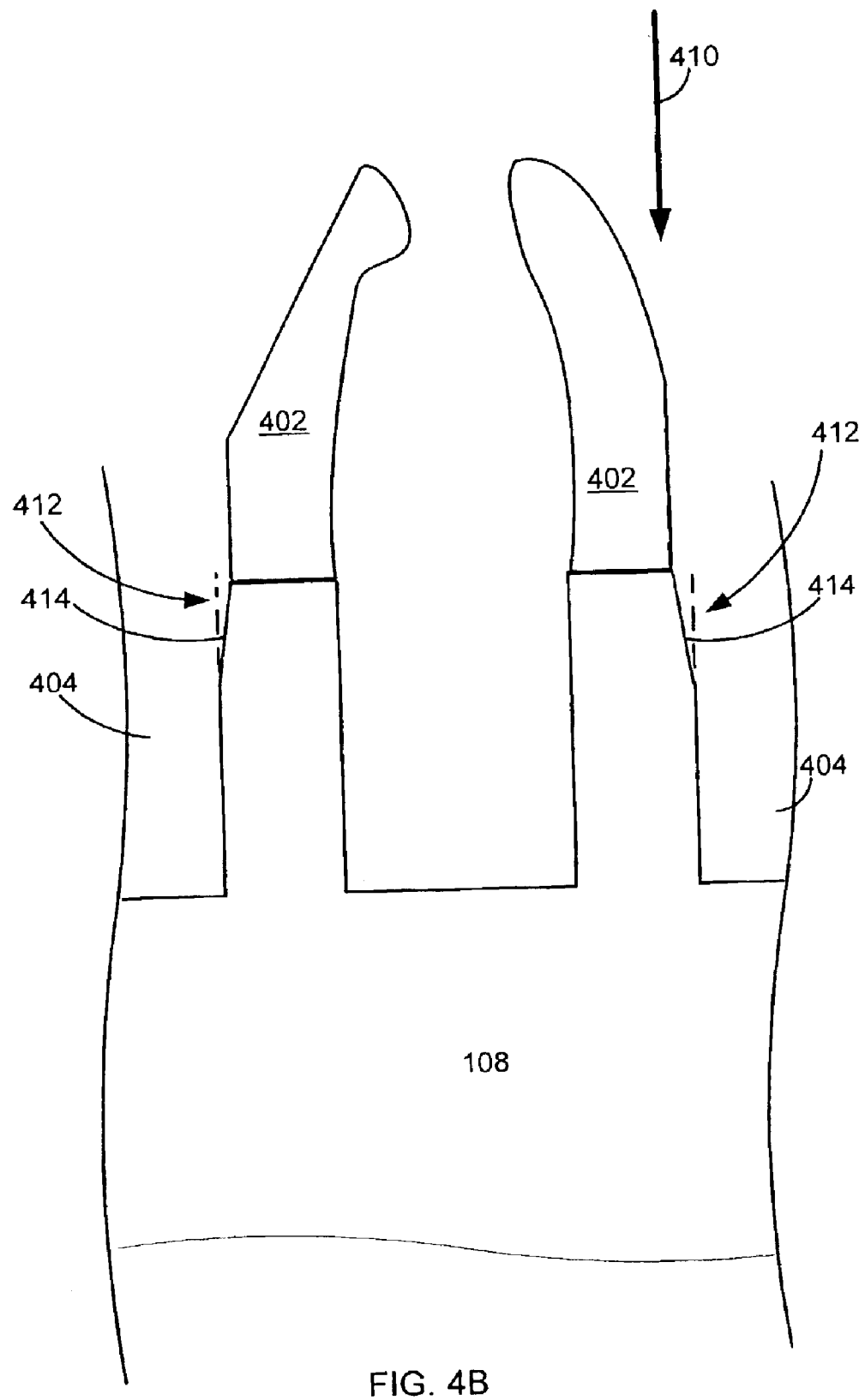
FIG. 4B is a cross-sectional view of the layer stack of FIG. 4A with irregular features.
Figure 5:
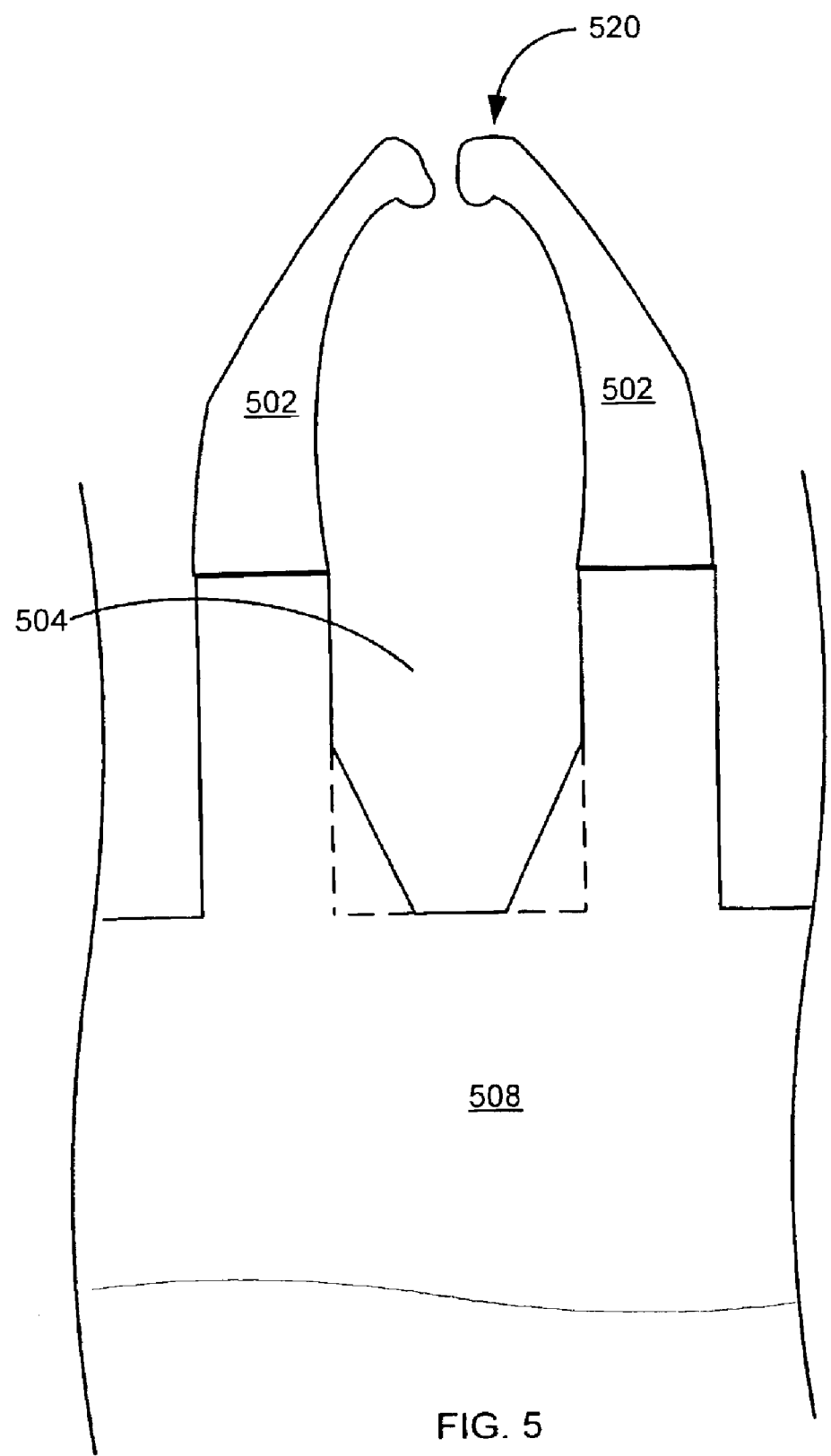
FIG. 5 is a cross-sectional view of a layer stack, where photoresist distortion has created a partial block.
Figure 6:
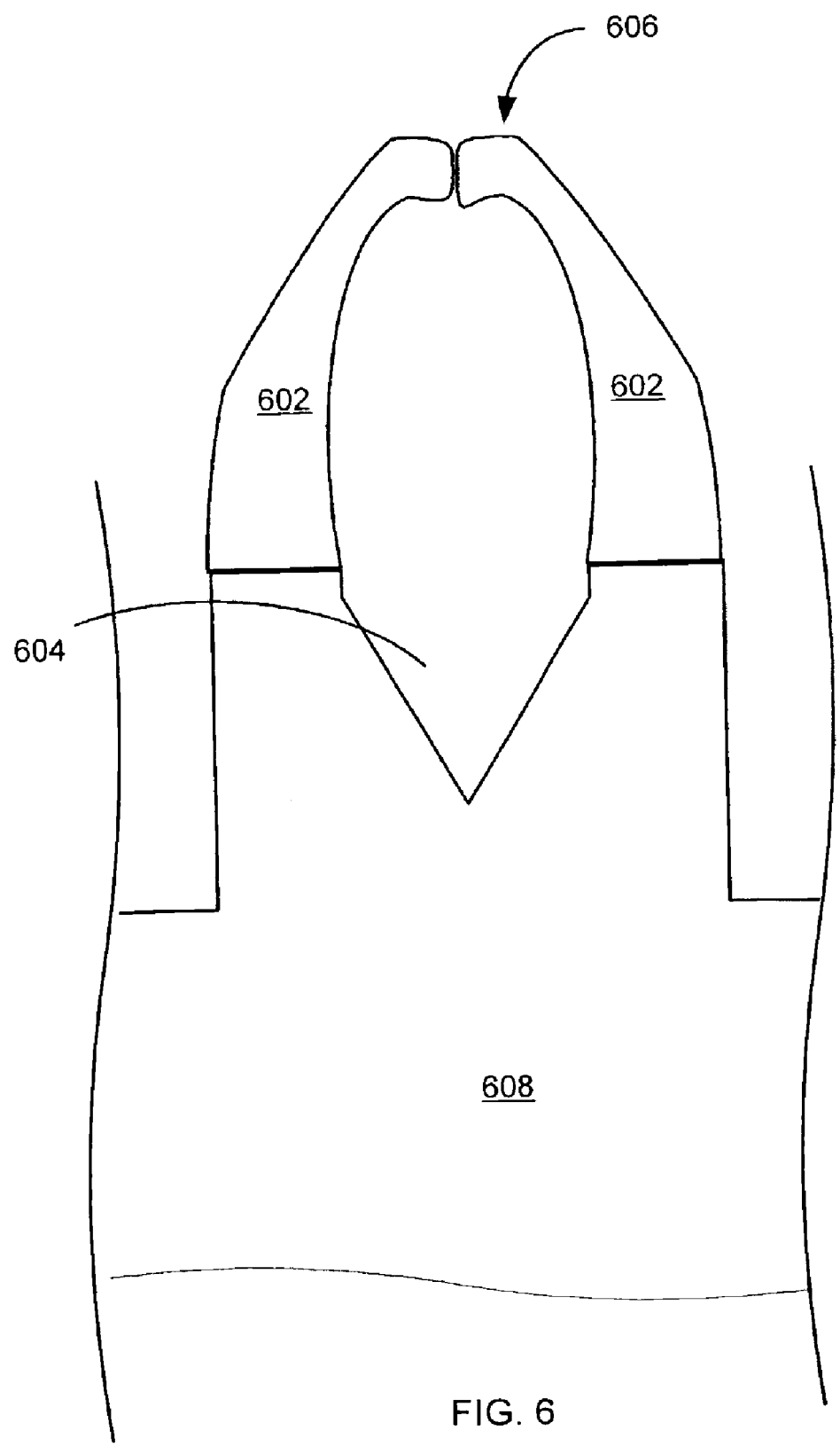
FIG. 6 is a cross-sectional view of a layer stack, where photoresist distortion has created a complete block.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In the following paragraphs, approximate ranges believed to be suitable for performing the inventive method of improving process results through the introduction of additional gasses into a plasma processing chamber are disclosed. Although the suitable ranges are disclosed herein below in connection with a Capacitive Coupled Plasma Exelan™ dual frequency system (available from Lam Research Corporation™ of Fremont, Calif.), these ranges should serve as guidelines to enable one skilled in the art to adapt the disclosed methods to other plasma processing systems. It is expected to have a similar behavior on any Capacitively Coupled Plasma etch tool with double or multiple, tunable frequencies, regardless of the wafer size (200 or 300 mm).

Coburn et al., U.S. Pat. No. 6,228,775 B1 (herein "Coburn") suggests that a low ionization energy gas, such as xenon or krypton, may be employed in conjunction with a fluorocarbon or hydrofluorocarbon gas to etch the oxide layer. Coburn in column 6, lines 10–30, teaches that the addition of a low ionization potential gas, such as xenon and krypton, prevents polymerization from dominating over etching, which prevents a polymerization etch stop in high aspect ratio features. To achieve the goal of preventing polymerization from dominating over etching during an oxide etching, Coburn in column 8, lines 17–26, teaches that the flow rate of the low ionization potential gas such as xenon or krypton be limited to "a percentage of less than about 29% of the total flow rate of the low ionization potential gas and the one or more fluorine and carbon containing gases." and that "[m]ore preferably, the percentage flow of the low ionization potential gas is less than about 20% of the flow of the low ionization potential gas and the one or more fluorine and carbon containing gases."

Since Coburn is concerned with preventing polymerization from dominating, Coburn teaches away from using a high flow of xenon in oxide etches. The inventors herein found that at relatively low xenon flow rates, such as at the rate suggested by Coburn, do not reduce photoresist wiggle, to the extent desired. In addition, nothing in Coburn suggests the reduction of photoresist wiggle. Additionally, Coburn only discusses an oxide etch using xenon or krypton, in conjunction with a fluorocarbon or hydrofluorocarbon gas.

The present invention addresses the photoresist distortion problem, which interferes with the etching process due to photoresist distortion and which is different from the problem of polymerization dominating process. As mentioned before, such photoresist distortion or wiggling causes, among other problems, the "false" etch stop problem. This is caused by the complete blocking of the photoresist mask opening that can occur for extensive PR wiggling, and it does not have any correlation with the polymerization dominating etch stop process.

It is discovered by the inventors that a high flow of xenon is effective in substantially reducing or eliminating photoresist wiggling (that is, greatly reducing photoresist wiggling to the point where defects due to photoresist wiggling are null). It is believed that the addition of xenon with low ionization energy causes a decrease in the population of electrons with higher energy and an increase in the population of electrons with lower energy. Lower energy electrons prevent high energy electron dissociation and ionization of the etchant. Species arriving at substrate have lower energy and do not distort the photoresist. Since the ionization energy for krypton is larger than xenon, the lowering in the energy from krypton is not enough to avoid the photoresist wiggling. This is in agreement with the experimental result that the photoresist wiggling is not eliminated by the addition of krypton in place of xenon to the plasma.

In a non-obvious fashion, it was discovered that use of an etchant source gas with a high flow rate of xenon gas eliminates photoresist wiggling. More importantly, at the high flow rate used, Xe gas in an etchant source gas mixture improves substantially the overall etch profile, in particular it helps in obtaining the desired bottom critical dimension (CD) of the etched feature. Furthermore, at this high flow rate, the Xe in the etchant source gas mixture also maintains a high level of photoresist selectivity, an important consideration for etching narrow, high aspect ratio features. As the term is employed herein, a high flow rate of xenon refers to a flow rate that is at least 35% of the combined flow rate of the xenon and other gases forming the etchant source gas mixture. Preferably, the flow rate of xenon is at least about 40–95% of the combined flow rate of the xenon and other gases forming the etchant source gas mixture. Most preferably the flow rate of xenon is at least between about 45–95% of the combined flow rate of the xenon and other gases forming the etchant source gas mixture. In addition, argon may also be added, so that the argon and xenon form a diluent gas mixture. The diluent gas mixture with the active etchant gas forms the etch source gas mixture. Preferably the flow rate of the xenon is greater than 40% of the flow rate of the diluent gas. More preferably, the flow rate of the xenon is greater than 50% of the flow rate of the diluent gas. Most preferably, the flow rate of the xenon is between about 50–90% of the sum of the flow rates of the diluent gas. In other embodiments, the argon may be replaced with other noble gases, such as helium, neon, and/or krypton, to form the diluent gas.

Figure 7:
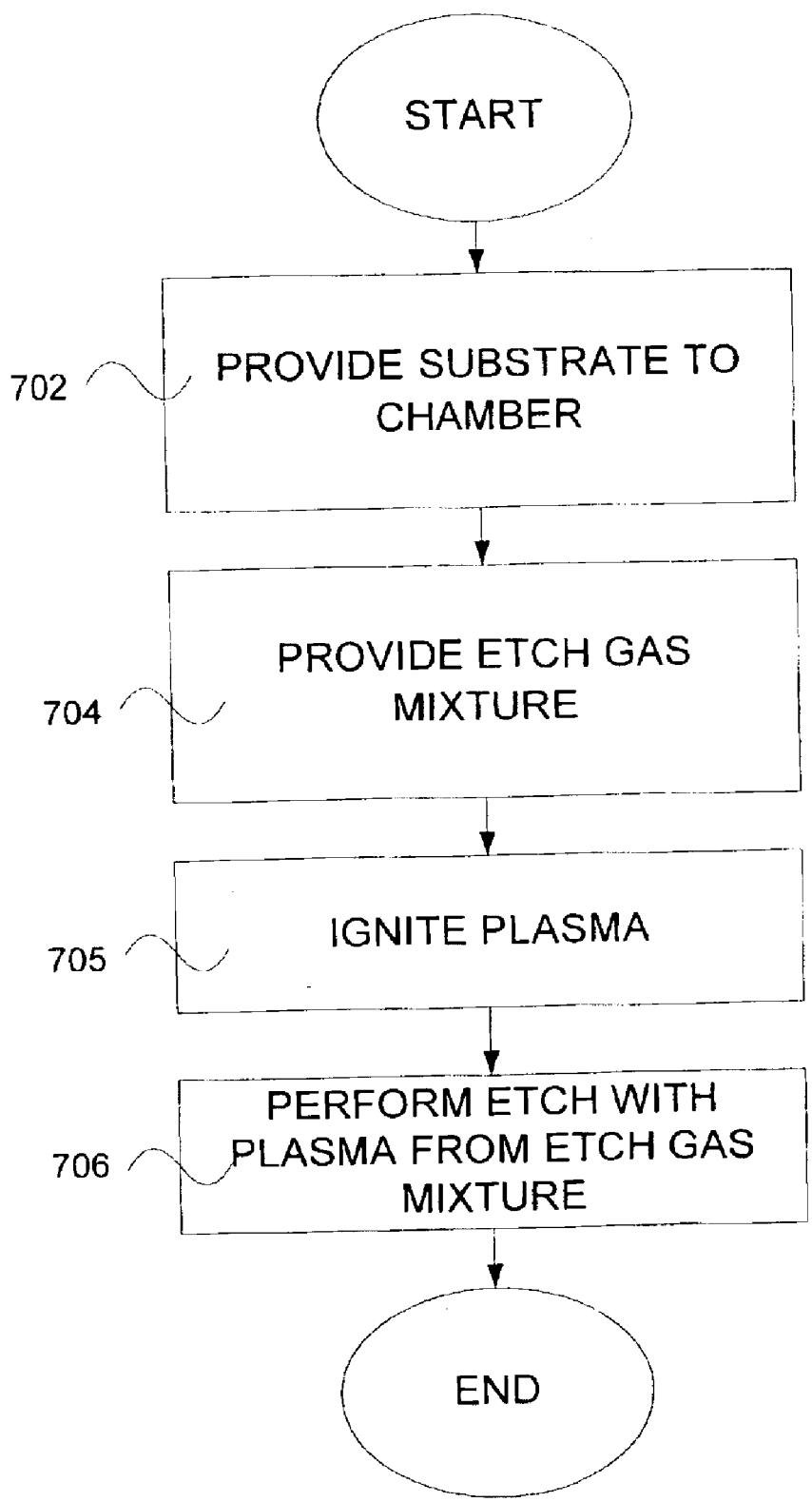
FIG. 7 is a flow chart of a preferred embodiment of the invention.

FIG. 7 is a flowchart showing steps for reducing photoresist wiggling while etching through a layer in a plasma processing system. In step 702, a substrate with a layer disposed below a photoresist mask is provided to a plasma processing chamber. Preferably, the plasma processing chamber is a capacitively coupled multiple frequency etch chamber. In step 704, a flow of an etchant source gas mixture is provided into the plasma processing chamber. The etchant source gas mixture comprises xenon, an active etchant, and optionally an additional diluent. The xenon has a flow rate of at least 35% of the flow rate of the total etchant gas source mixture. In step 705, a plasma is created from the etchant source gas mixture. In step 706, an etching is performed by the plasma, where the resulting etch reduces or eliminates photoresist wiggling.

In a preferred embodiment of the invention, the layer to be etched is an oxide layer, which is disposed below a photoresist mask. The etchant source gas mixture comprises, a high flow rate xenon, $O_2$, fluorocarbon and/or hydrofluorocarbons gases. The etchant source gas mixture may further comprise an additional diluent of a noble gas, such as argon. In this embodiment the $O_2$, fluorocarbon gas and/or hydrofluorocarbons are the active etchant. The fluorocarbon-based etchant that can etch the oxide layer may include $CF_4$, $C_2F_6$, $C_2F_4$, $C_3F_6$, $C_4F_8$, $C_4F_6$, or $C_5F_8$. These fluorocarbon-based gases generally include the $C_xF_y$ component in their makeup, where x and y are integers. Further, invention herein may be practiced with any hydrofluorocarbon-based gas that can etch the oxide layer, including for example $CHF_3$, $CH_2F_2$, $CH_3F$, $C_2H_2F_4$. These hydrofluorocarbon-based gases generally include the $C_xH_yF_z$ component in their makeup, where x, y, and z are integers. The etchant mixture may contain one, two or more of these fluorocarbons and/or hydrofluorocarbons. Also, examples of other active etchants would be hydrogen and carbon monoxide. The oxide layer etched may be doped or undoped silicon dioxide. Dopants may include for example boron or phosphorous and may include such well known oxide as TEOS.

Figure 9:
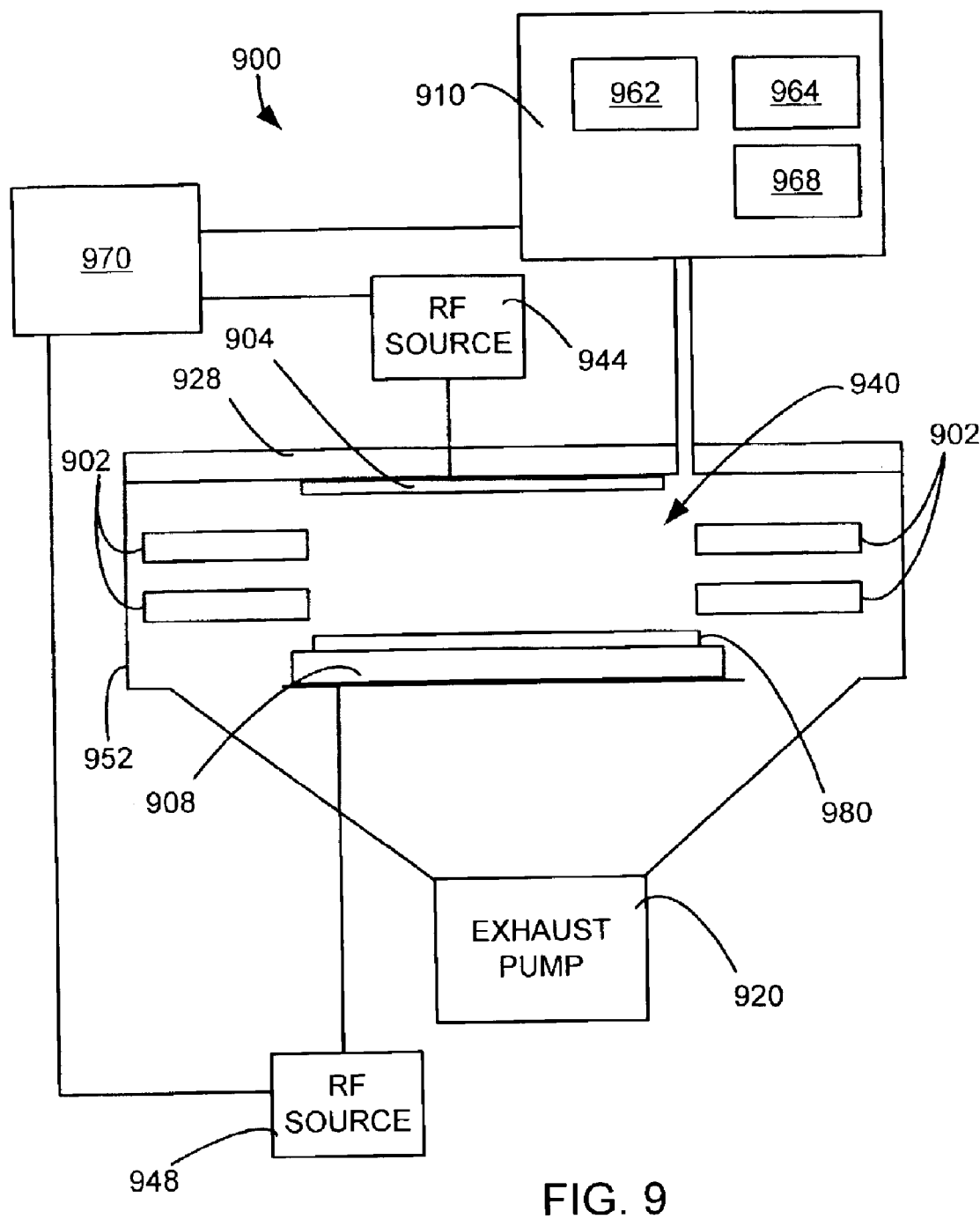
FIG. 9 is a schematic view of a capacitively coupled multiple frequency etch chamber.

FIG. 9 is a schematic view of a capacitively coupled multiple frequency etch chamber 900 that may be used for etching in an embodiment of the invention. The etch chamber 900 comprises confinement rings 902, an upper electrode 904, a lower electrode 908, an etchant source gas mixture source 910, a controller 970, and an exhaust pump 920. Within etch chamber 900, a wafer 980, which is formed from the layer to be etched or on which the layer to be etched is formed, is positioned upon the lower electrode 908. The lower electrode 908 incorporates a suitable substrate chucking mechanism (e.g., electrostatic, mechanical clamping, or the like) for holding the wafer 980. The reactor top 928 incorporates the upper electrode 904 disposed immediately opposite the lower electrode 908. The upper electrode 904, lower electrode 908, and confinement rings 902 define the confined plasma volume. Gas is supplied to the confined plasma volume by etchant source gas mixture source 910 and is exhausted from the confined plasma volume through the confinement rings 902 and an exhaust port by the exhaust pump 920. A first RF source 944 is electrically connected to the upper electrode 904. A second RF source 948 is electrically connected to the lower electrode 908. Chamber walls 952 surround the confinement rings 902, the upper electrode 904, and the lower electrode 908. Both the first RF source 944 and the second RF source 948 may comprise a 27 MHz power source and a 2 MHz power source. Different combinations of connecting RF power to the electrodes are possible. In the case of Exelan HPT/2300DFC™ made by LAM Research Corporation™ of Fremont, Calif., that may be used in a preferred embodiment of the invention, both the RF sources are connected to the lower electrode, and the upper electrode is grounded. The etchant source gas mixture source 910 has a xenon source 962, a fluorocarbon source 964, and an oxygen source 968. Other component gas sources, such as a hydrofluorocarbon source, may be included in the etchant source gas mixture source 910. Another diluent gas, as is argon, can be also added to the etchant source gas mixture source 910. The controller 970 is programmed to provide the etchant source gas mixture with a high flow rate of xenon. The controller 970 may also be used to control the RF sources 944, 948 and other components.

EXAMPLE

In one example, an etchant source gas comprising 20 standard cubic centimeter (sccm) of $C_4F_8$, 10 sccm of $O_2$, 150 sccm of Ar, and 150 sccm of Xe is employed to create a plasma in a Exelan HPT/2300DFC™ or Exelan HPT™ plasma etcher, manufactured by LAM Research™ of Fremont, Calif., in order to etch an oxide layer. In this example, the photoresist is deep UV, and is about 0.6 um thick. The etch is configured to create 2.0 um deep rectangular cell capacitor structures, with the critical dimension of 0.12 um×0.35 um. During the etch, the pressure within the chamber is about 50 mTorr. The helium cooling pressure is about 15 Torr. The electrode powers is about 1000 watts for the 27 MHz RF generator and 1000 watts for the 2 MHz RF generator. Etching was conducted for 210 seconds and photoresist wiggling, as well as defects there from, are substantially absent in the resultant etch features.

Figure 8:
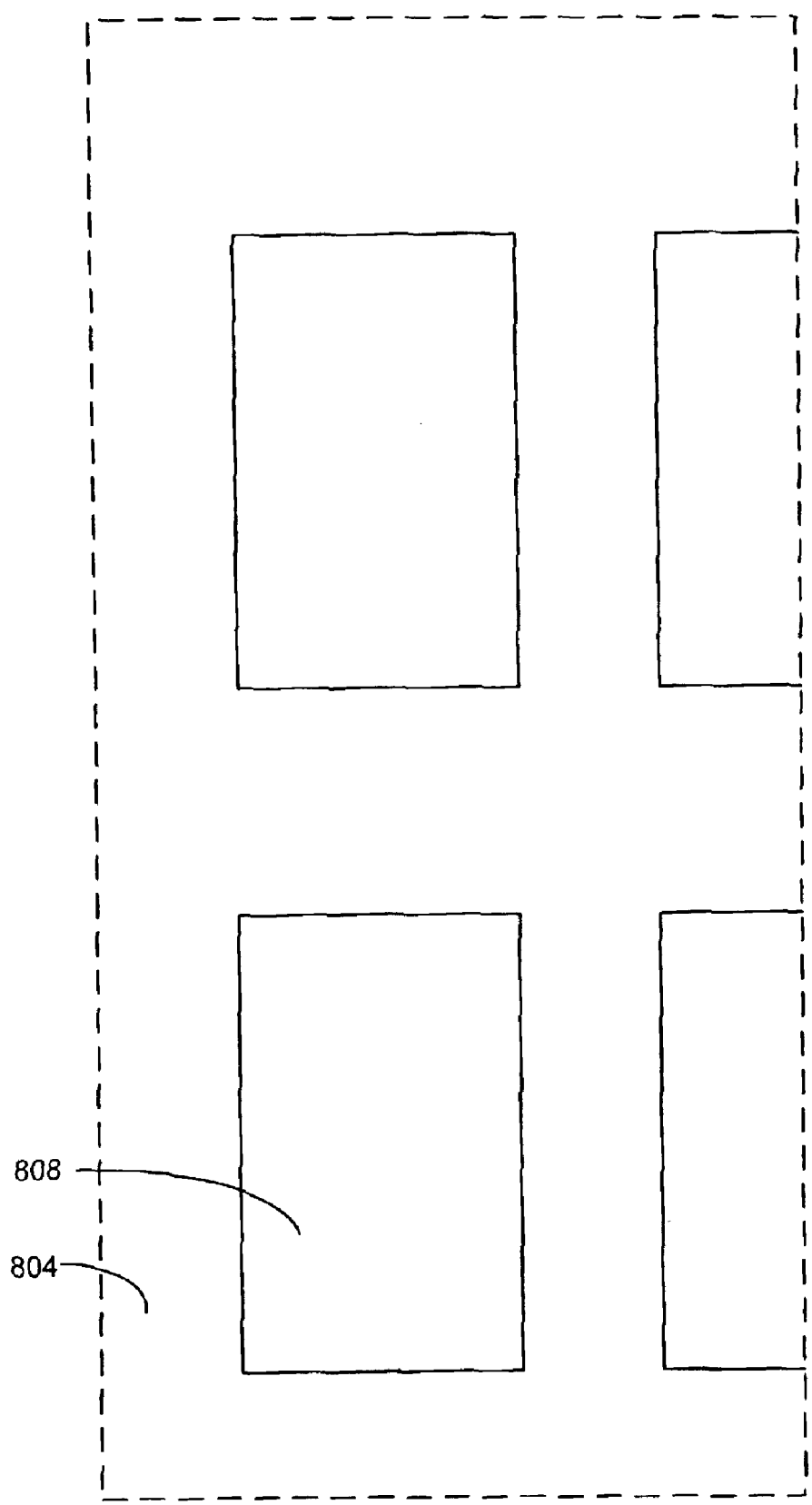
FIG. 8 is a top view of an etched substrate with no photoresist distortion.

For illustration purposes, FIG. 8 illustrates a top view of a photoresist mask 804, which exhibits substantially no PR wiggling due to use of a high flow of xenon in the etch. As a result, well formed features 808 may be etched through the photoresist mask 804.

While this invention has been described in terms of several preferred embodiments, there are alterations, permutations, modifications, and various substitute equivalents which fall within the scope of this invention. For example, although the discussion is made herein with reference to the Exelan HPT/2300DFC™ plasma processing system and specific parameters suitable therefore, the invention also applies to other plasma etching systems, including inductively coupled plasma etchers and other capacitively coupled plasma etchers, with dual or multiple tunable frequencies. Furthermore, one skilled in the art, given the disclosure, would be able to make adjustments to the parameters disclosed herein to practice the invention with other etch processes, other PR thicknesses, other types of photoresist materials other than the deep UV and 193 nm UV of the examples, other fluorocarbon-based and/or hydrofluorocarbon-based gases, other types of materials to be etched, other types of active etchants and other types of etchers without departing from the scope and spirit of the present invention.

Additionally, although the described example was performed on a 200 mm substrate, a complete elimination of the photoresist wiggling was obtained for the 300 mm substrates. It is expected that similar performances will be obtained regardless of the dimension of the substrate.

Additionally, it is believed that the addition of xenon is beneficial in addressing the detrimental phenomena associated with photoresist wiggling irrespective of the type of plasma etch. Thus, it is believed that the addition of xenon may substantially eliminate such detrimental photoresist wiggling-related phenomena in etches other than oxide etches, and/or using chemistry other than the aforementioned fluorocarbon-based or hydrofluorocarbon-based chemistries.

The invention may be used to prevent photoresist wiggling, during the etching of layers of other materials disposed below a photoresist mask, such as a silicide layer, a hard mask layer, an antireflective coating, a barrier layer, or a pure silicon layer. In addition, other etchant source gas mixtures may be used to etch a layer under a photoresist mask. Thus, having disclosed exemplary embodiments and the best mode, modifications, substitute permutations and variations may be made to the disclosed embodiments while remaining within the subject and spirit of the invention as defined by the following claims.

What is claimed is:

1. In a plasma processing system having therein a plasma processing chamber, a method for substantially reducing photoresist wiggling while etching a feature into a layer on a substrate, comprising:

introducing the substrate having thereon the layer disposed below a photoresist mask into the plasma processing chamber;

flowing an etchant source gas mixture into the plasma processing chamber, wherein the etchant source gas mixture comprises xenon and an active etchant, wherein a flow rate of the xenon is at least 35% of etchant source gas mixture, wherein the etchant gas source mixture further comprises argon, wherein the flow rate of the xenon is between about 50%–90% of a sum of flow rates of the argon and xenon;

striking a plasma from the etchant source gas mixture; and etching the feature into the layer with the plasma from the etchant source gas mixture, wherein the flow rate of xenon reduces photoresist wiggling.

2. The method of claim 1, wherein the flow rate of the xenon is less than 95% of the etchant source gas mixture.

3. The method of claim 1, wherein the plasma processing chamber is a multiple, tunable frequency capacitively coupled etch chamber, wherein the striking a plasma strikes the plasma using capacitive coupling.

4. The method of claim 1, wherein the layer to be etched is a silicon oxide layer.

5. The method of claim 4, wherein the active etchant is selected from at least one of a fluorocarbon and a hydrofluorocarbon.

6. The method of claim 5, wherein the active etchant further comprises oxygen.

7. The method, as recited in claim 1, wherein the photoresist is a deep UV photoresist, and wherein the layer to be etched is a silicon oxide layer, and wherein the plasma processing chamber is a capacitively coupled multiple frequency etch chamber.

8. The method, as recited in claim 1, wherein the photoresist is a 193 nm photoresist, and wherein the layer to be etched is a silicon oxide layer, and wherein the plasma processing chamber is a capacitively coupled multiple frequency etch chamber.

* * * * *